United States Patent [19]
Hornak et al.

[11] Patent Number: 5,365,187
[45] Date of Patent: Nov. 15, 1994

[54] POWER AMPLIFIER UTILIZING THE VECTOR ADDITION OF TWO CONSTANT ENVELOPE CARRIERS

[75] Inventors: Thomas Hornak, Portola Valley; William J. McFarland, Mountain View, both of Calif.

[73] Assignee: Hewlett-Packard Company, Palo Alto, Calif.

[21] Appl. No.: 145,353

[22] Filed: Oct. 29, 1993

[51] Int. Cl.$^5$ ............ H03G 1/00; H03G 9/00; H03G 11/00
[52] U.S. Cl. .................... 330/10; 330/107; 330/149; 330/151; 330/52
[58] Field of Search ........... 330/107, 104, 149, 52, 330/10, 151, 207 A, 290, 291

[56] References Cited
U.S. PATENT DOCUMENTS

| | | | |
|---|---|---|---|
| 4,580,105 | 4/1986 | Myer | 330/149 |
| 5,105,164 | 4/1992 | Fisher et al. | 330/149 |
| 5,124,665 | 6/1992 | McGann | 330/149 |
| 5,237,288 | 8/1993 | Cleveland | 330/149 |
| 5,264,807 | 11/1993 | Okubo et al. | 330/149 |

Primary Examiner—William L. Sikes
Assistant Examiner—Fetsum Abraham

[57] ABSTRACT

A power amplifier having a gain factor of G for generating an output signal from a low power amplitude and phase modulated input signal. The power amplifier generates first and second constant envelope signals. Each constant envelope signal has the same frequency as said input signal. The first constant envelope signal has the same amplitude as the second constant envelope signal but differs in phase from the first constant envelope signal by an amount depending on the amplitude of the input signal. The output signal is generated by vectorially adding the first and second constant envelope signals. The amplifier has a feedback loop which operates by determining the difference in amplitude between the input signal and a signal having an amplitude 1/G times the amplitude of the output signal. The phase difference between the first and second constant envelope signals is altered so as to reduce the determined difference in amplitude. In one embodiment of the present invention, the difference in phase between the input and output signals is also measured. The phase difference is used to determine a phase increment that is added to both constant envelope signals so as to reduce the measured phase difference between the input and output signals.

7 Claims, 6 Drawing Sheets

POWER AMPLIFIER UTILIZING THE VECTOR ADDITION OF TWO CONSTANT ENVELOPE CARRIERS

FIELD OF THE INVENTION

The present invention relates to RF amplifiers, and more particularly, to amplifiers that utilize the addition of two constant amplitude phase modulated signals to provide an amplitude modulated signal.

BACKGROUND OF THE INVENTION

Mobile wireless phone and data communication have become increasingly popular. These applications, however, pose two special problems. First, the RF carrier modulation by which information is transmitted must demand the smallest bandwidth possible due to the general shortage of available spectrum. As a result, both the amplitude and the phase (i.e., frequency) of the carrier must be modulated. Amplifying the modulated carrier without excessive distortion in the transmitter output stage imposes significant linearity constraints on the output stage amplifier.

Second, the power efficiency of the mobile transmitter is very important because the mobile end of wireless communication link is battery powered. Typically, the transmitter output stage is the largest power consumer; hence, improvement in this stage are the most important. One of the most efficient power amplifiers are the class C RF amplifiers in which the output transistor conducts current only at the time when the collector-emitter voltage is at its lowest value. Unfortunately, these amplifiers are very nonlinear and introduce substantial amplitude distortion. Because of this distortion, class C amplifiers are used mainly in FM transmitters in which the amplitude or "envelope" of the RF carrier is constant, and hence, such distortion has no effect.

One method for avoiding this distortion with class C amplifiers that still allows linear amplitude modulation is to generate two signals with constant amplitude using the class C amplifiers and then combine these signals. The amplitude modulation is achieved by modulating the relative phase of the two constant amplitude signals. Denote the two signals by $V_1$ and $V_2$, respectively.

$$V_1 = V \sin[\omega t + mt(t) + a(t)] \quad (1)$$

and $$V_2 = V \sin[\omega t + mt(t) - a(t)] \quad (2)$$

These two signals are added vectorially in a "power combiner" to generate a phase and amplitude modulated carrier $V_{out} = 2q(t)V \sin[\omega + m(t)]$, where V is the amplitude of both $V_1$ and $V_2$ and $0 < q(t) < 1$. Here m(t) and q(t) are the desired phase and amplitude modulations of the resulting carrier v, and a(t) and $-a(t)$ are the additional phase modulations of the two constant envelope components $V_1$ and $V_2$. If the power combiner generates the output signal V by vectorially adding $V_1$ and $V_2$, the resulting amplitude modulation q(t) will be $q(t) = \cos[a(t)]$. If the power combiner vectorially subtracts $V_1$ and $V_2$, q(t) will be $q(t) = \sin[a(t)]$.

In all of the following discussions we will assume that the bandwidth of phase modulation m(t), amplitude modulation q(t), and phase modulation a(t), is only a small fraction of the carrier frequency.

Methods of generating the two signals $V_1 = V \sin[\omega t + m(t) + a(t)]$ and $V_2 = V \sin[\omega t + m(t) - a(t)]$ resulting in the desired signal $V_{out} = 2q(t)V \sin[\omega t + m(t)]$ at the output of the power combiner are known to the prior art. For example, F. J. Casadevall, RF Design, February 1990, pp. 41–48 produces the components $V_1$ and $V_2$ starting with a low power, low frequency $\omega'$ version of the desired phase and amplitude modulated output signal. Casadevall generates a signal $v'_{in} = q(t) \cdot V_{in} \sin[\omega' t + m(t)]$. Here, $\omega' << $, the final carrier frequency. This signal is digitized and a digital signal processor is used to generate Cartesian components $I_1$, $Q_1$ representing $V_1$, and $I_2$, $Q_2$, representing $V_2$ but at the low frequency $\omega'$. Then, $V_{in}$, is upconverted with the aid of an RF oscillator, a phase shifter and mixers. This is accomplished by upconverting the two sets of I and Q components to frequency $\omega$. Next, the upconverted I and Q components are summed to generate the constant envelope components $V_1$ and $V_2$ which are then used to drive two highly efficient power amplifiers which, in turn, drive the power combiner.

This approach has several disadvantages. First, the circuitry has a high degree of complexity. Second, any phase or amplitude errors in the mixers and in the power amplifiers appear as distortion at the power combiner output. Third, this circuit cannot simply be substituted for a conventional RF power amplifier because the input frequency must be low to match the speed of the digitizer and digital signal processor.

A second prior art solution to this problem is presented in D. C. Cox, IEEE Transactions on Communications, December 1974, pp. 1942–1945. This system generates $a(t) = \arcsin[q(t)]$ by starting with a low power, phase and amplitude modulated input signal $v_{in} = q(t) \cdot V_{in} \sin[\omega t + m(t)]$ at the final frequency $\omega$. This signal is processed in parallel by a limiter to generate a constant envelope, phase modulated only signal $u = U \sin[\omega + m(t)]$, and an envelope detector to generate a baseband replica of the amplitude modulation q(t). A feedback loop which includes a phase modulator feeding a phase detector is also used. The phase modulator modulates the signal from the limiter ($u = U \sin[\omega t + m(t)]$ by an amplified error signal causing the phase detector output to follow q(t). This implements an inverse sine function so that the signal at the input of the phase modulator, when amplified by the constant envelope amplifier, is $V_1 = V \sin[\omega t + m(t) + a(t)]$, where $a(t) = \arcsin[q(t)]$. Signal $V_2$ with phase angle $-a(t)$ is derived in a similar way.

This approach has two disadvantages. First, it is not suitable for modulation schemes in which the carrier assumes temporarily zero amplitude, such as BPSK and QPSK. The limiter supplying $u = U \sin[\omega t + m(t)]$ loses its output signal during the zero carrier amplitude period. Second, any amplitude or phase errors in the power amplifiers appear as distortion at the power combiner output.

A third prior art solution to this problem is presented in D. C. Cox and R. P. Leek, "Component Signal Separation and Recombination for Linear Amplification with Nonlinear Components", IEEE Transactions on Communications, November 1975, pp. 1281–1287. This system uses essentially the same method as the above-described Cox publication, except frequency multiplication is used. The frequency multiplication decreases the operating range, and thus, improves the linearity of the phase modulator. The phase modulator is driven by a frequency equal to one third of the operating frequency ($\omega/3$), its output frequency is then multiplied by 3 to $\omega$ in a frequency multiplier. Since frequency multiplication multiplies phase changes, the phase modulator operates over a third of the phase angle range required by a(t). Unfortunately this approach suffers from the same problems as that described with reference to Cox's original proposal.

A fourth prior art attempt to solve this problem is described in Leon Couch "A VHF Linc Amplifier", Conference Proceedings IEEE Southeastcon '82, Apr. 4–7, 1982. In this system, analog signal processing is used to develop the I and Q components of both $V_1$ and $V_2$ in a manner analogous to that described in the Casaderail reference. The circuits first separate the input signal into a limited phase modulated signal and a baseband envelope signal. The envelope signal is acted on by various circuitry including squaring and square rooting circuitry. This solution suffers from the same disadvantages as the systems taught by Cox. In addition, an analog squaring and an analog square rooting circuit are required which increases the system cost and complexity.

Finally, A. Bateman, "The Combined Analogue Locked Loop Universal Modulator (CALLUM)", IEEE Vehicular Technology Conference Digest, 1992, pp. 759–763 teaches a system which generates $V_1$ and $V_2$ from the baseband I and Q components of the input signal. In this circuit, low power versions of $V_1$ and $V_2$ are generated by two voltage controlled oscillators (VCOs). The frequency control input of each VCO is driven so that the correct frequency and phase are generated for $V_1$ and $V_2$. This is done by generating I and Q signals from the output signal obtained by adding $V_1$ and $V_2$. These I and Q signals are compared with the original input I and Q signals. Any error between compared signals is amplified and drives the VCO frequency control input, forcing the error to zero.

The approach also has two disadvantages. First, for full 4-quadrant operation, the CALLUM modulator must be complemented by a switching matrix not described in the paper. Further, the CALLUM modulator cannot be simply substituted for conventional power amplifiers because it requires baseband I and Q inputs.

Broadly, it is the object of the present invention to provide an improved circuit for generating phase and amplitude modulated signals with high efficiency.

It is a further object of the present invention to provide a modulation circuit in which any amplitude or phase errors in the power amplifiers do not appear as distortions at the power combiner output.

It is yet another object of the present invention to provide a modulation circuit that can be simply substituted for a conventional RF power amplifier These and other objects of the present invention will become apparent to those skilled in the art from the following detailed description of the invention and the accompanying drawings.

SUMMARY OF THE INVENTION

The present invention is a power amplifier having a gain factor of G for generating an output signal from a low power amplitude and phase modulated input signal. The power amplifier generates first and second constant envelope signals. Each constant envelope signal has the same frequency as said input signal. The first constant envelope signal has the same amplitude as the second constant envelope signal but differs in phase from the first constant envelope signal by an amount depending on the amplitude of the input signal. The output signal is generated by vectorially adding the first and second constant envelope signals. The amplifier has a gain feedback loop which operates by determining the difference in amplitude between the input signal and a signal having an amplitude G times less than the amplitude of the output signal. The phase difference between the first and second constant envelope signals is altered so as to reduce the determined difference in amplitude. In one embodiment of the present invention, the difference in phase between the input and output signals is also measured. The phase difference is used to determine a phase increment that is added to both constant envelope signals so as to eliminate the measured phase difference between the input and output signals.

DETAILED DESCRIPTION OF THE INVENTION

Figure 1:
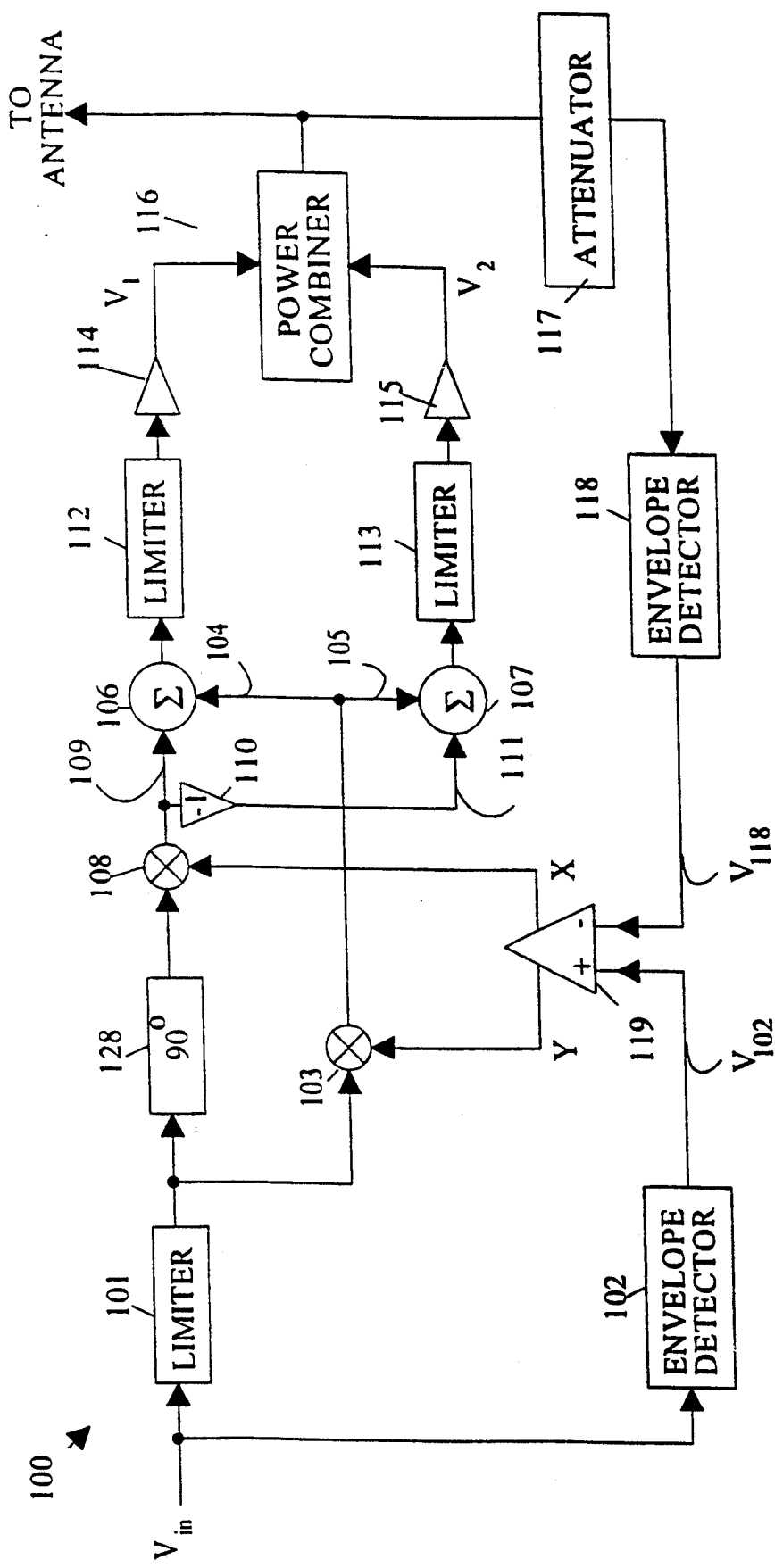
FIG. 1 is a schematic diagram of a power amplifier according to the present invention

Refer now to FIG. 1 which is a block diagram of a power amplifier 100 according to the present invention. Power amplifier 100 first separates the phase modulation and amplitude modulation of the low power input signal $v_{in} = q(t)V_{in} \sin[\omega(t) + m(t)]$ using limiter 101 and envelope detector 102. For the limiter to work properly, the envelope of the input wave form must never decrease to zero. The output of limiter 101 is a signal with the same phase modulation as the input signal $v_{in}$ but with constant envelope. The output of limiter 101 becomes the first constant envelope signal and the output of limiter 101 phase shifted by 90 degrees by phase shifter 128 becomes the second constant envelope signal. The output of limiter 101 is fed via voltage controlled gain cell 103 to the first inputs 104 and 105 of summing circuits 106 and 107. Summing circuit 106 generates a signal that is the weighted sum of the first and second constant envelope signals, the weight factors being introduced by gain cells 103 and 108. The output of limiter 101 is also fed via the 90 degree phase shifter 128 and voltage controlled gain cell 108 to the second input 109 of summing circuit 106. This signal is also fed to the second input 111 of summing circuit 107 via unity gain inverting amplifier 110. The summing circuit 107 generates the weighted difference of the first and the inverted second constant envelope signal. In this case, the weight factors are the same as those used by summing circuit 106.

The outputs of summing circuits 106 and 107 each drive one of two power amplifiers 114 and 115 via limiters 112 and 113, respectively. Limiters 112 and 113 guarantee that the power amplifiers are driven by constant amplitude signals. The constant envelope outputs $V_1$ and $V_2$ of the two power amplifiers are combined in power combiner 116 into a single amplitude and phase modulated output signal $V_{out}$ which feeds the antenna or some other useful load.

The manner in which power combiner 116 is constructed will be discussed in more detail below. For the purposes of this discussion, it is sufficient to note that power combiner 116 vectorially adds the outputs of power amplifiers 114 and 115.

Output signal $V_{out}$ of power combiner 116 is fed via attenuator 117 to envelope detector 118 which generates a baseband signal $V_{118}$ equal to the amplitude modulation envelope of the attenuated output signal $V_{out}$. The attenuation of attenuator 117 is equal to the circuit's desired overall voltage gain G. Envelope detector 102 generates a baseband signal $V_{102}$ equal to the amplitude modulation envelope of the input signal $v_{in}$. The two baseband signals are compared in high gain differential amplifier 119 with complementary outputs, X and Y. It should be noted that the power combiner 116 may combine $V_1$ and $V_2$ to form $V_{out}$ by vector summing $V_1$ and $V_2$ or by finding the vector difference. The voltage on output X and Y follow the dependence:

$$V_y = V_o + Av_d$$

and (1)

$$V_x = V_o - Av_d$$

in the case $V_{out}$ is the vector sum of $V_1$ and $V_2$. If power combiner 116 combines the signals by finding the vector difference, then $$V_y = V_o - Av_d$$

and (2)

$$V_x = V_o + Av_d$$

Here, $v_d = V_{102} - V_{118}$; A is the gain of amplifier 119, and $V_O$ is the common mode voltage. Hence, for any $v_d$, the sum of $V_x$ and $V_y$ is $2V_O$. When $v_d = 0$, then $V_x = V_y = V_O$. In addition, the voltages output from summers 106 and 107 are chosen sufficiently large to drive limiters 112 and 113 into saturation. Voltage $V_y$ drives the control input of voltage controlled gain cell 103, and voltage $V_x$ drives the control input of voltage controlled gain cell 108. This feedback loop assures that any amplitude errors in the power amplifiers do not appear as distortions at the power combiner output.

Assume that $v_{in}$ is only amplitude-modulated. It is assumed that output voltage $V_{out}$ of power combiner 116 is the result of vector addition of $V_1$ and $V_2$ in power combiner 116. If the amplitude of the output carrier $V_{out}$ is less than G-times the amplitude of the input signal $V_{in}$, the signal $V_{118}$ generated by envelope detector 118 will be lower than the signal $V_{102}$ generated by envelope detector 102. This will increase $V_y$ and decrease $V_x$ at the outputs of amplifier 119. As a result, the phase angle between the outputs of amplifiers 114 and 115 will decrease. This will result in an increase in the voltage $V_{out}$ of the power combiner, thus correcting for the case in which the output from the power combiner was too low. If the amplitude of the output of power combiner 116 increases above G-times the amplitude of input signal $V_{in}$, $V_y$ will decrease and $V_x$ will increase leading to an increase in the phase angle between $V_1$ and $V_2$. This will, in turn, reduce the output of amplitude of power combiner 116.

If the output voltage of power combiner 116 results from the subtraction of $V_1$ and $V_2$, the operation of amplifier 119 is given by equation (2). In this case, if the amplitude of the output signal is too small there will be a decrease in $V_y$ and an increase in $V_x$, and the amplitude error will thus be corrected.

In describing the operation of amplifier 100, it was assumed that input voltage $V_{in}$ was only amplitude modulated. That is, $v_{in}$ has zero phase modulation. Consider the case in which the input is phase modulated by a phase angle m(t). That is, $$v_{in} = q(t)V\sin[\omega(t) + m(t)]$$

A constant or slowly changing phase difference between input voltage $v_{in}$ and output voltage from power combiner 116 caused, for example, by the delay in all circuits between limiter 101 and the output port of combiner 116, does not change the operation of amplifier 100. However, additional, fast, amplitude dependent phase errors F(t) between input signal $v_{in}$ and the output of power combiner 116 caused by dynamic parasitic phase shifts in the circuit elements of amplifier 100 would deteriorate amplifier linearity.

Amplifier linearity can be improved by adding a phase control loop. The phase control loop, in contrast to the amplitude control loop, has to correct only phase errors which should be non-existent in the ideal case, i.e., the corrections needed should be small. In the present invention, either of two methods for correcting for phase can be employed. In the first method, the inputs to power amplifiers 114 and 115 are adjusted by changing the weight factors controlling the inputs of summing circuits 106 and 107. In the second method, the phase of both inputs is changed by altering the phase of the output of limiter 101.

Figure 2:
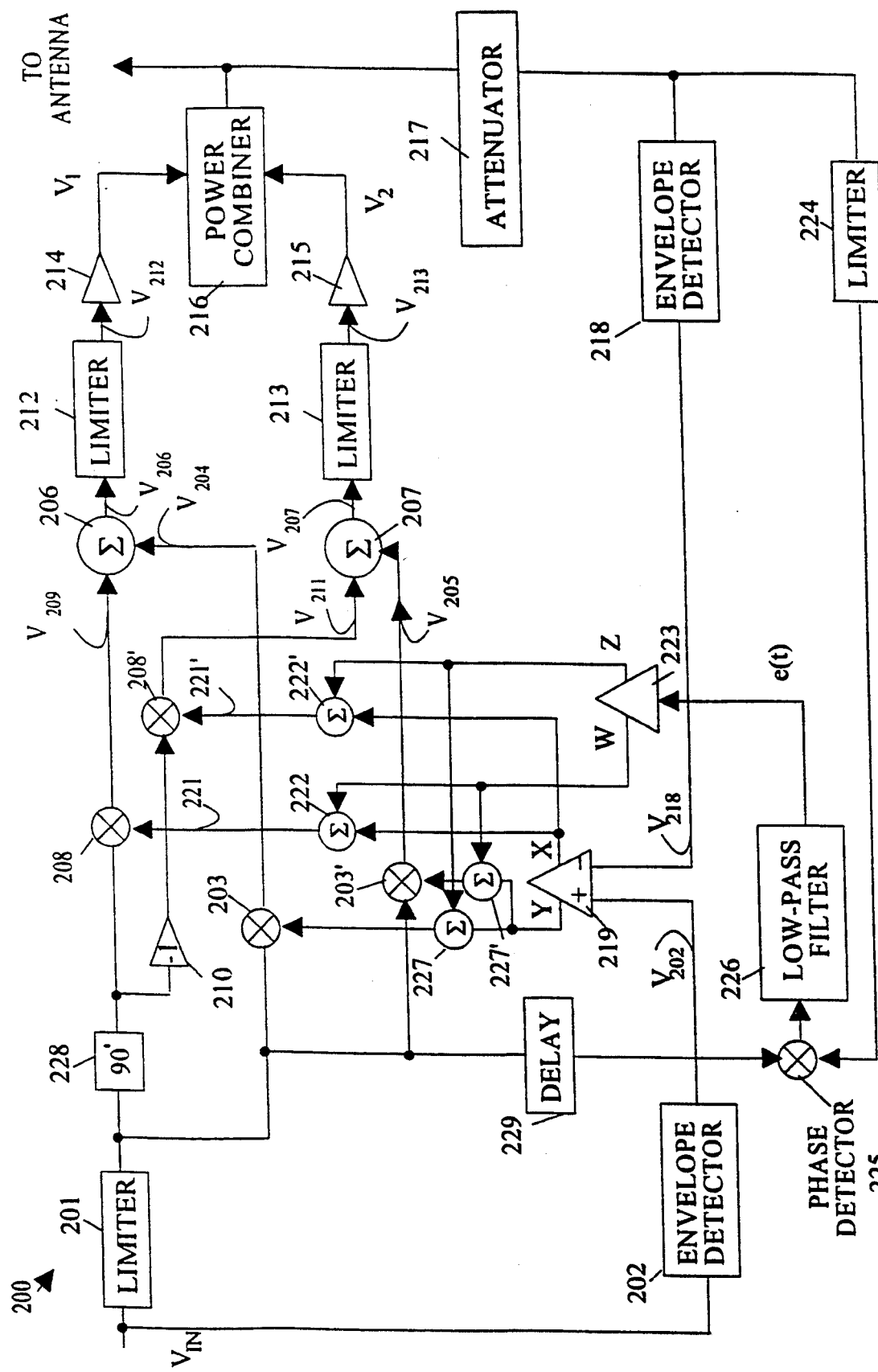
FIG. 2 is a schematic diagram of an embodiment of the present invention having a phase correction loop.

An amplifier 200 according to the present invention which includes a phase control loop of the first type is shown in FIG. 2 at 200. Circuit elements in FIG. 2 which serve analogous functions to circuit elements shown in FIG. 1 are numbered with numbers that differ by 100 from those in FIG. 1. These elements will not be discussed in further detail here except as they relate to the phase control loop. Basically, this embodiment of the present invention provides one set of control circuits that adjusts the amplitude of the output of power combiner 216 by changing the phase angle between the outputs of amplifiers 214 and 215 and a second set of control elements that changes the phase of both amplifier outputs in the same direction to compensate for phase errors.

Amplifier 200 includes a phase detector 225 which is driven by the output signal via attenuator 217 and limiter 224. Limiter 224 erases the amplitude modulation but maintains the desired phase modulation m(t) as well as any static phase delay and any parasitic phase modulation F(t) of the output voltage from power combiner 216. The other input of phase detector 225 is driven via compensating delay circuit 229 from limiter 201. The phase shift in circuit 229 is set to equal the static phase difference between output voltage of limiter 201 and output voltage of limiter 224. Because both inputs of phase detector 225 include the desired phase modulation m(t), the phase difference seen by phase detector 225 is only F(t), where F(t) now includes both the dynamic phase error as well as the residual static phase error left over by imperfect static phase error compensation by delay circuit 229. The output of phase detector 225 is low-pass filtered by filter 226 to generate an error voltage e(t) which has the same sign as F(t). Voltage e(t) is amplified by amplifier 223 with complementary outputs W and Z.

The function of voltage controlled gain cell 108 shown in FIG. 1 has been divided between cells, 208 and 208'. Inverting amplifier 210 has also been relocated relative to inverting amplifier 110 shown in FIG. 1. This allows the phase of $V_{206}$ and $V_{207}$ to be changed in opposite directions as before, and to be changed also in the same direction.

Figure 3:
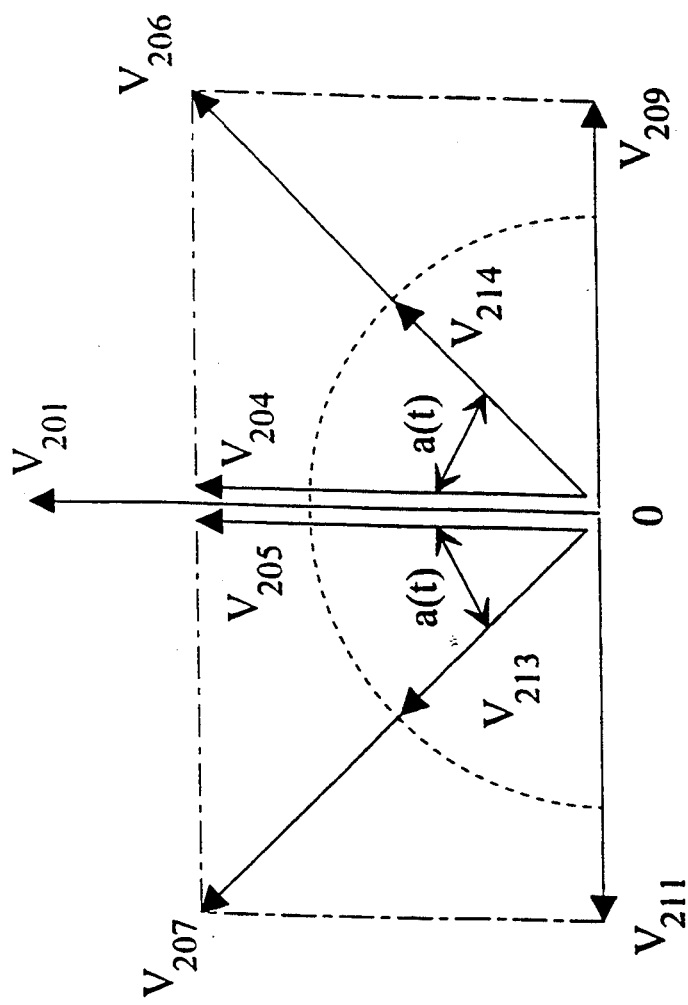
FIG. 3 illustrates the phase and amplitude relationships between various signals generated by components of the power amplifier shown in FIG. 2.

Voltage controlled gain cell 103 shown in FIG. 1 has been divided into two cells, 203 and 203'. Cell 203 drives input 204 of summing circuit 206, and cell 203' drives input 205 of summing circuit 207. Between output Y of amplifier 119 and input 120 of voltage controlled gain cell 103 shown in FIG. 1, another summing circuit, 227, was introduced. Similarly, between output Y of amplifier 219 and input 220' of cell 203' another summing circuit 227' has been introduced. The second inputs of summing circuits 227 and 227' are tied to outputs W and Z of amplifier 223 respectively. This connection is chosen so that the output voltages $V_x$ and $V_y$ of amplifier 219, and the output voltages $V_w$ and $V_z$ of amplifier 223 cause changes in the magnitude of voltages on inputs 204,205,209,211 of summing circuits 206 and 207 according to the following table. See also FIG. 3 where the phasors are labeled in accordance with the signal labels in FIG. 2.

|  | $V_{204}$ | $V_{205}$ | $V_{209}$ | $V_{211}$ |
|---|---|---|---|---|
| $Vy - Vx > 0$ | + | + | − | − |
| $Vy - Vx < 0$ | − | − | + | + |
| $Vw - Vz > 0$ | − | + | + | − |
| $Vw - Vz < 0$ | + | − | − | + |

Figure 4:
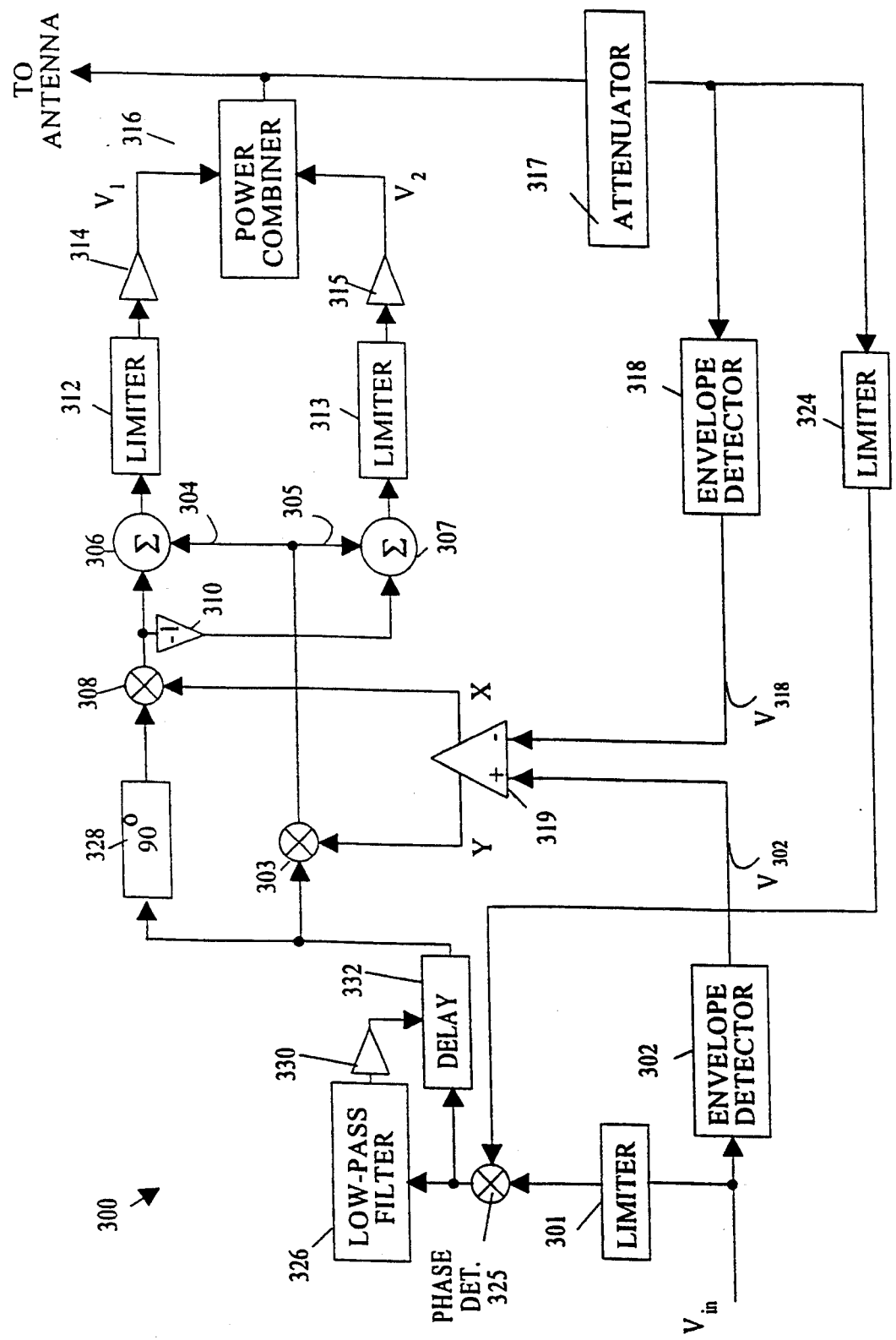
FIG. 4 is a schematic diagram of a second embodiment of the present invention having a phase correction loop.

An example of an amplifier according to the present invention in which the phase correction loop operates by changing the phase of the output of limiter 101 in response to observed phase errors is shown in FIG. 4 at 300. Circuit elements which serve as functions analogous to the functions described with respect to FIG. 1 are numbered with numbers differing from the numbers used in FIG. 1 by 200 and will not be discussed further here. Amplifier 300 is based on a voltage controlled delay circuit 332 which operates fast enough to also compensate for the dynamic components of phase error F(t). Amplifier 300 utilizes the delay circuit in the forward path. Phase detector 325 compares the phase difference between limiter 301 and limiter 324 and controls delay circuit 332 via low-pass filter 326 and amplifier 330 to keep the phase difference negligible. Low pass filter 326 and amplifier 330 must pass a bandwidth equal to the dynamic components of F(t), however, these components are not influenced to first order by the desired phase modulation m(t).

Figure 5:
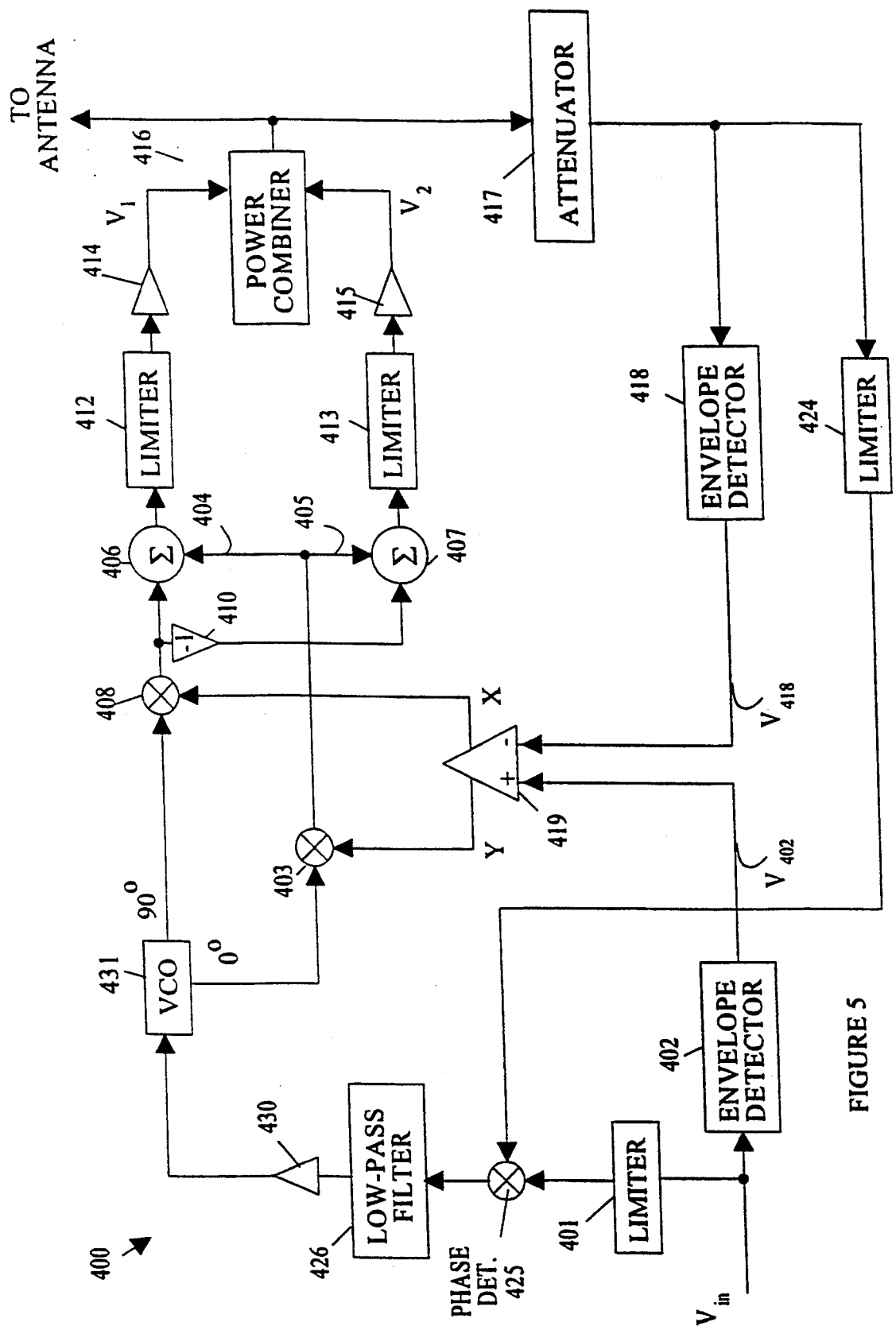
FIG. 5 is a schematic diagram of a third embodiment of the present invention having a phase correction loop.

Voltage controlled delay circuit 332 may be replaced by a voltage controlled oscillator (VCO). An embodiment of the present invention utilizing a VCO for this purpose is shown in FIG. 5 at 400. Circuit elements which serve functions analogous to the functions described with respect to FIG. 1 are numbered with numbers differing from the numbers used in FIG. 1 by 300. In this embodiment, the output of VCO 431, controlled by phase detector 425 via low-pass filter 426 and amplifier 430, keeps the phase difference between limiters 401 and 424 negligible. With the unlimited phase range of the VCO, compensation can be provided even for a large static phase error F(t). However, VCO 431 must produce the static and dynamic components of the phase error F(t) while also producing the desired phase modulation, m(t). VCOs having 90 degree taps are readily available; hence, the 90 degree phase shifter 128 shown in FIG. 1 has been replace by a 90 degree tap from the VCO 431.

Figure 6:
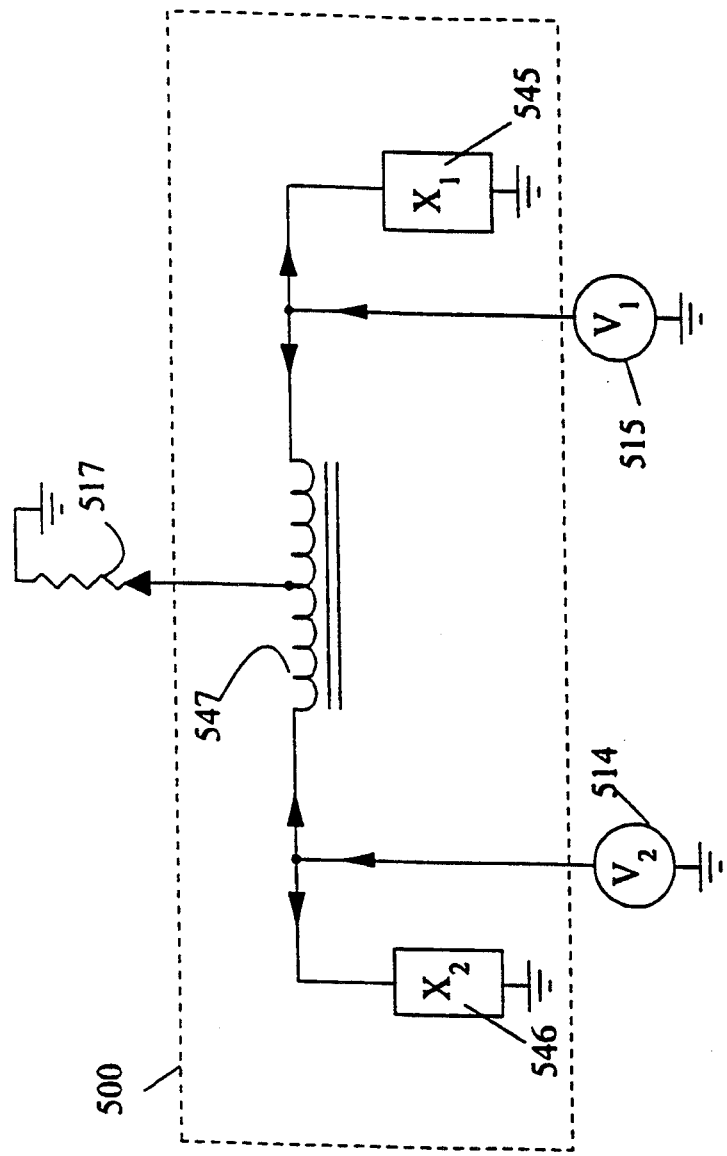
FIG. 6 is a schematic diagram of a power combiner that may be used in conjunction with the present invention.

Refer now to FIG. 6 which is a schematic drawing of a power combiner 500. Power combiner 500 adds the two signals $V_1$ and $V_2$. Power combiner 500 uses a transformer 547 having a center tap to perform the addition. The resulting signal is applied to load 517. Reactances 545 mid 546 are chosen such that the load provided by power combiner 500 is as near to a purely resistive load as possible over the range of phase shifts between $V_1$ and $V_2$.

Various modifications to the present invention will become apparent to those skilled in the art from the foregoing description and accompanying drawings. Accordingly, the present invention is to be limited solely by the scope of the following claims.

What is claimed is:

1. A power amplifier having a gain factor of G for generating an output signal from a lower power amplitude modulated input signal, said power amplifier comprising:

means for generating first and second constant envelope signals, each said constant envelope signal having the same frequency as said input signal, said second constant envelope signal differing in phase from said first constant envelope signal by an amount depending on the amplitude of said input signal;

means for vectorially adding said first and second constant envelope signals to obtain said output signal;

means for detecting any deviation of the amplitude ratio of said output and said input signals from G; and means for altering said phase difference between said first and second constant envelope signals so as to reduce said detected deviation of amplitude ratio.

2. The power amplifier of claim 1 wherein said means for generating said first and second constant envelope signals comprises:

means for generating a first limited signal having the same frequency as said input signal but an amplitude independent of said input signal;

means for generating first and second component signals from said first limited signal, said first and second component signals differing in phase by a fixed amount;

means for generating said first constant envelope signal from a weighted sum of said first and second component signals, the weight factors used in said sum depending on said detected deviation of amplitude ratio; and means for generating said second constant envelope signal from a weighted difference of said first and second component signals, the weight factors used in said difference depending on said detected deviation of amplitude ratio.

3. The power amplifier of claim 1 further comprising:

means for generating a first limited signal having the same frequency as the input signal but an amplitude independent of the input signal;

means for generating a second limited signal having the same frequency as the output signal but an amplitude independent of the output signal;

means for measuring any difference in phase between the first and second limited signals; and means for altering the phase of said output signal in response to said measured difference being different from zero so as to reduce said measured difference in phase.

4. The power amplifier of claim 3 wherein said means for altering the phase of said output signal comprises means for changing the phase of both of said constant envelope signals in the same direction by an amount that depends on said measured difference in phase.

5. The power amplifier of claim 2 further comprising:

means for generating a second limited signal having the same frequency as the output signal but an amplitude independent of the output signal;

means for measuring any difference in phase between the first and second limited signals; and means for altering the phase of said output signal in response to said measured difference being different from zero so as to reduce said measured difference in phase, wherein said means for changing the phase of both of said constant envelope signals comprises means for changing said weight factors used in said weighted sums and differences in response to said measured difference in phase.

6. The power amplifier of claim 3 wherein said means for altering the phase of said output signal comprises a variable delay circuit having a delay determined by said measured difference in phase.

7. The power amplifier of claim 3 wherein said means for altering the phase of said output signal comprises a voltage controlled oscillator having an output determined by the frequency of said input signal and by said measured difference in phase.

* * * * *

UNITED STATES PATENT AND TRADEMARK OFFICE
CERTIFICATE OF CORRECTION

PATENT NO.   : 5,365,187
DATED        : November 15, 1994
INVENTOR(S)  : Hornak et al.

Page 1 of 1

It is certified that error appears in the above-identified patent and that said Letters Patent is hereby corrected as shown below:

Column 1,
Line 53, "[w+m(t)]," should read -- [wt+m(t)], --;
Line 60, "$V_1$ and $V_2$" should read -- $V_1$ and $V_2$ --;

Column 3,
Line 13, "Casaderail" should read -- Casadevall --;
Line 29, "VCO" should read -- VC0 --;
Line 32, "$V_I$ and $V_2$" should read -- $V_1$ and $V_2$ --;
Line 35, "VCO" should read -- VC0 --;

Column 5,
Line 42, "$V_d$=O" should read -- $V_d$=0 --;

Column 8,
Line 20, "$V_1$ and $V_2$" should read -- $V_1$ and $V_2$ --;

Signed and Sealed this

Twenty-fifth Day of December, 2001

Attest:

*Attesting Officer*

JAMES E. ROGAN
*Director of the United States Patent and Trademark Office*